United States Patent [19]
DeMoranville et al.

[11] Patent Number: 6,001,777
[45] Date of Patent: Dec. 14, 1999

[54] METHOD OF TEXTURING A SUPERCONDUCTIVE OXIDE PRECURSOR

[75] Inventors: Kenneth L. DeMoranville, Jefferson; Qi Li, Marlborough; Peter D. Antaya, Sutton; Craig J. Christopherson, Worcester; Gilbert N. Riley, Jr., Marlborough, all of Mass.; Jeffrey M. Seuntjens, Bangau, Singapore

[73] Assignee: American Superconductor Corp., Westborough, Mass.

[21] Appl. No.: 08/902,588

[22] Filed: Jul. 29, 1997

[51] Int. Cl.[6] .................................................. H01L 39/00
[52] U.S. Cl. ........................ 505/430; 264/614; 264/620; 505/431; 505/433
[58] Field of Search .................................. 264/614, 620; 505/430, 431, 433

[56] References Cited

U.S. PATENT DOCUMENTS

| | | | |
|---|---|---|---|
| 5,283,232 | 2/1994 | Kohno et al. | 505/1 |
| 5,288,699 | 2/1994 | Sato et al. | 505/1 |
| 5,304,602 | 4/1994 | Yamamoto et al. | 505/433 |
| 5,661,113 | 8/1997 | Danyluk et al. | 425/335 |

FOREIGN PATENT DOCUMENTS

| | | |
|---|---|---|
| 0 281 474 A2 | 9/1988 | European Pat. Off. . |
| 0 435 286 A1 | 7/1991 | European Pat. Off. . |

OTHER PUBLICATIONS

Grasso et al., "Development of retangular Bi(2223) wires with reduced anisotrophy", Supercond. Sci. Technol., vo. 10, pp. 223–226.

*Primary Examiner*—Christopher A. Fiorilla
*Attorney, Agent, or Firm*—Fish & Richardson P.C.

[57] ABSTRACT

A method of forming a textured superconductor wire includes constraining an elongated superconductor precursor between two constraining elongated members placed in contact therewith on opposite sides of the superconductor precursor, and passing the superconductor precursor with the two constraining members through flat rolls to form the textured superconductor wire. The method includes selecting desired cross-sectional shape and size constraining members to control the width of the formed superconductor wire. A textured superconductor wire formed by the method of the invention has regular-shaped, curved sides and is free of flashing. A rolling assembly for single-pass rolling of the elongated precursor superconductor includes two rolls, two constraining members, and a fixture for feeding the precursor superconductor and the constraining members between the rolls. In alternate embodiments of the invention, the rolls can have machined regions which will contact only the elongated constraining members and affect the lateral deformation and movement of those members during the rolling process.

8 Claims, 5 Drawing Sheets

METHOD OF TEXTURING A SUPERCONDUCTIVE OXIDE PRECURSOR

This invention was made with Government support under Contract No. DE-FG02-96ER82123 awarded by the Department of Energy. The Government has certain rights in this invention.

BACKGROUND OF THE INVENTION

The geometries in which high-performance superconducting oxide composites may be successfully fabricated are constrained by the necessity of texturing the material to achieve adequate critical current density. The current-carrying capacity of a superconducting oxide composite depends significantly on the degree of crystallographic alignment and intergrain bonding of the oxide grains, together known as "texturing", induced during the composite manufacturing operation.

Known processing methods for texturing superconducting oxide composite articles include various forms of heat treatment as well as longitudinal deformation. Certain superconducting oxide grains can be oriented along the direction of an applied strain, a phenomenon known as deformation-induced texturing (DIT). Longitudinal deformation techniques like pressing, drawing and rolling have been used to induce grain alignment of the oxide superconductor c-axis perpendicular to the plane or direction of elongation.

Known methods of texturing a precursor superconductor wire by rolling include groove rolling and Turks head forming. In groove rolling, the precursor wire is inserted between two rotating cylindrical rolls separated by a known distance to shape the precursor. The desired shape is machined into the rolls. Often the rolls are in contact with each other. Turks head forming is a variation of conventional groove rolling in which two additional rolls are located perpendicular to the main rolls and are used to laterally restrict the superconductor wire during deformation.

Heat treatment under conditions which at least partially melt and regrow desired superconducting phases may promotes texturing by enhancing the anisotropic growth of the superconducting grains, a phenomenon known as reaction-induced texturing (RIT).

However, not all texturing methods are equally applicable to, or effective for, all superconducting oxides. Most of these materials have very few known effective texturing mechanisms. For example, known techniques for texturing the two-layer and three-layer phases of the bismuth-strontium-calcium-copper-oxide family of superconductors (BSCCO 2212 and BSCCO 2223, respectively) are described in Tenbrink, Wilhelm, Heine and Krauth, Development of Technical High-Tc Superconductor Wires and Tapes, Paper MF-1, Applied Superconductivity Conference, Chicago (Aug. 23–28, 1992), and Motowidlo, Galinski, Hoehn, Jr. and Haldar, Mechanical and Electrical Properties of BSCCO Multifilament Tape Conductors, paper presented at Materials research Society Meeting, Apr. 12–15, 1993. Techniques for manufacturing multifilamentary articles with sufficient texturing to provide acceptable critical current densities from BSCCO 2223 are presently limited to the production of highly aspected forms such as tapes.

The effectiveness of a particular DIT technique will depend on how closely the applied strain vectors correspond to the slip planes in the superconducting oxide. Thus, superconducting oxides such as the BSCCO family, which have a micaceous structure characterized by highly anisotropic preferred cleavage planes and slip systems, are known to be most effectively DIT textured by non-axisymmetric techniques such as pressing and rolling, which create highly aspected (greater than about 5:1) forms. A DIT technique applicable to forming low aspected forms has been described, for example, in U.S. patent application Ser. No. 08/554,693 filed Nov. 7, 1995, entitled LOW-ASPECT RATIO SUPERCONDUCTOR WIRE, hereby incorporated by reference. For perovskite structures like the 123 phase of the yttrium-barium-copper-oxide (YBCO) family, which lack preferred cleavage planes and slip systems, longitudinal deformation is generally less effective in improving critical current density and the differences in texturing obtainable by axisymmetric and non-axisymmetric techniques are less pronounced.

Materials which exhibit peritectic melting can be effectively textured in a variety of geometries by melt textured growth, an RIT technique. Peritectic decomposition and the reformation of the oxide superconductor from the liquid+ (other) solid phase is the basis for melt textured growth of the two-layer phases of the bismuth-strontium-calcium-copper-oxide family of superconductors (BSCCO-2212) in round wire and tape forms, as described, for example, in Kase et al, IEEE Transmag 27(2), 1254 (March 1991). Because 2212 totally melts and reforms during melt-textured growth, the texturing induced by deformation prior to melting will not influence the final structure.

However, some of the most promising superconducting oxides, such as BSCCO 2223, cannot be effectively textured by the melt-textured growth technique. Instead of peritectic melting, BSCCO 2223 exhibits irreversible melting in that solid 2223 does not form directly from a liquid of 2223 composition. RIT techniques applicable to BSCCO 2223 have been described, for example in U.S. patent application Ser. No. 08/041,822, filed Apr. 1, 1993, entitled IMPROVED PROCESSING OF OXIDE SUPERCONDUCTORS, and U.S. patent application Ser. No. 08/198,912, filed Feb. 17, 1994, entitled IMPROVED PROCESSING OF OXIDE SUPERCONDUCTORS. The basis of such techniques is some type of partial melting, such as eutectic melting, solid solution melting or the formation of non-equilibrium liquids, in which the oxide superconductor coexists with a liquid phase rather than being totally decomposed. However, such techniques are inherently more dependent on the geometry of the initial phase than melt-textured growth, and texturing induced by deformation prior to the partial melting will have a significant impact on the texturing of the final product. The RIT technique described in U.S. patent application Ser. No. 08/041,822, cited above, for example, has been observed to provide the greatest improvement in the $J_c$'s of BSCCO 2223 samples when used in combination with a highly non-axisymmetric DIT technique.

SUMMARY OF THE INVENTION

The invention relates to a method of forming a textured superconductor conductor, such as a wire, tape, ribbon, or other elongated member having two substantially flat opposing sides. For convenience, all of these cross-sectional shapes shall be referred to as a wire. The invention features constraining an elongated superconductor precursor between two constraining elongated members placed in contact therewith on opposite sides of the superconductor precursor, and passing the superconductor precursor with the two constraining elongated members in contact therewith through flat rollers to form the textured superconductor wire.

In particular embodiments of the invention, the method includes selecting desired diameter constraining elongated members to control the width of the formed superconductor wire. The constraining members are selected to have mechanical properties, for example, ductility and strength, similar to that of the superconductor precursor.

According to another aspect of the invention, a textured superconductor wire is formed by the method of the invention.

In particular embodiments of the invention, the textured superconductor wire has regular-shaped sides. The sides can be curved. The textured superconductor wire is free of flashing.

According to another aspect of the invention, a rolling assembly for single-pass rolling of an elongated precursor superconductor into a textured superconductor wire includes first and second rolls and two constraining elongated members. The first roll is aligned to rotate about a first axis, and the second roll is aligned to rotate about a second axis parallel to the first axis. The rolls are spaced apart a selected distance to form a passage therebetween. The two constraining elongated members have mechanical properties similar to that of the precursor superconductor and are arranged for placement in contact with the precursor superconductor on opposite sides of the precursor superconductor when the precursor superconductor is passed through the passage between rolls to form the textured superconductor wire.

In one particular embodiment of the invention, the rolling assembly includes a fixture for feeding the precursor superconductor and the constraining elongated members between the first and second rolls. The fixture includes a slot dimensioned to receive the precursor superconductor and the constraining elongated members. The fixture also includes a tapered surface for guiding the precursor superconductor and the constraining elongated members between the first and second rolls.

Constrained rolling permits deformation with large area reductions while improving the filament quality as compared to known deformation techniques. Constrained rolling particularly facilitates the texturing of superconductor wires which are sensitive to cracking and/or shearing during deformation. Furthermore, constrained rolling permits deformation of precursor superconductors formed of filaments which are not bonded together. The technique also provides increased dimensional control over that of known techniques.

While the formation of textured superconductor wires has been described, it is important to note that the output from the rolling process is still typically not a final superconductor product and further processing, as is well known in the art, will usually be required to complete the superconductor manufacturing process.

The rolls can include roughened or machined circumferential regions for contact with the constraining members and for constraining or controlling, at least in part, lateral movement and/or deformation of said constraining members.

BRIEF DESCRIPTION OF THE DRAWINGS

Other objects, features and advantages of the invention will be apparent from the following description taken together with the drawings in which.

DESCRIPTION OF THE PREFERRED EMBODIMENT

Figure 1:
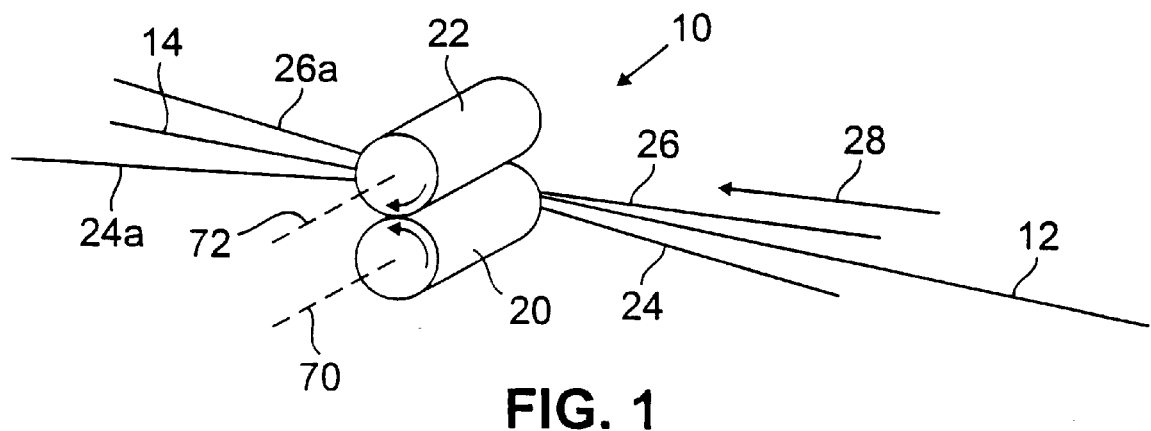
FIG. 1 is a diagrammatic perspective view of a constrained rolling assembly of the invention.
Figure 1A:
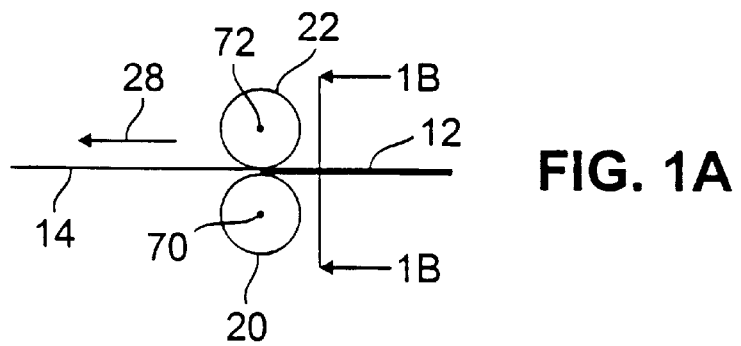
FIG. 1A is a side view of the constrained rolling assembly of FIG. 1.
Figure 1B:
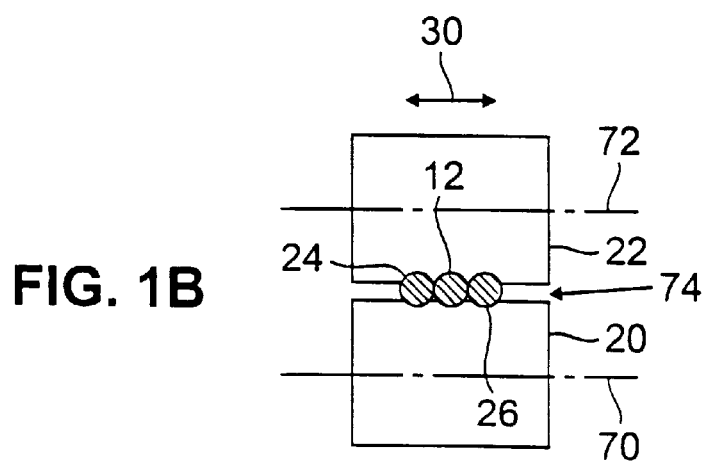
FIG. 1B is a sectional front view of the constrained rolling assembly showing the constrained elements prior to entering the rolls of FIG. 1.

Referring to FIGS. 1–1B, a rolling assembly 10 has been developed to deform an elongated superconductor precursor 12, of arbitrary cross-sectional shape, into a textured superconductor wire 14 without producing edge cracking, shearing, or flashing of the superconducting filaments. Textured superconductor wire 14 is typically an intermediate product requiring further processing to form a superconducting material. Precursor 12 is typically a round or tape or ribbon shaped cross-section, however, other cross-sectional configurations can be used.

Rolling assembly 10 includes flat rolls 20, 22 and elongated constraining members 24, 26. Roll 20 rotates about an axis 70, and roll 22 rotates about an axis 72 parallel to axis 70. Axes 70, 72 are spaced apart a selected distance to form a passage 74 therebetween. During rolling, constraining members 24, 26 are placed on either side of and in contact with the superconductor precursor 12, and the precursor and constraining members are together fed (in the direction of arrow 28) through rolls 20, 22 and are deformed in a single pass.

Constraining members 24, 26 influence the lateral spread (in the direction of arrow 30, FIG. 1B) of precursor 12 during rolling by providing mechanical support in the lateral direction. This provides for uniform deformation of precursor 12 and dimensional consistency of textured wire 14.

Figure 2:
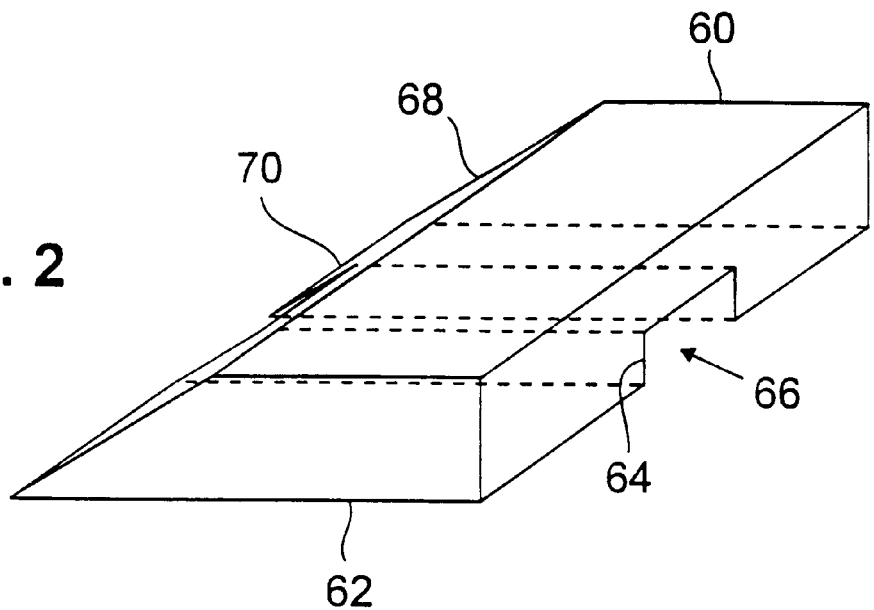
FIG. 2 is a perspective view of a fixture for use with the rolling assembly of FIG. 1.
Figure 2A:
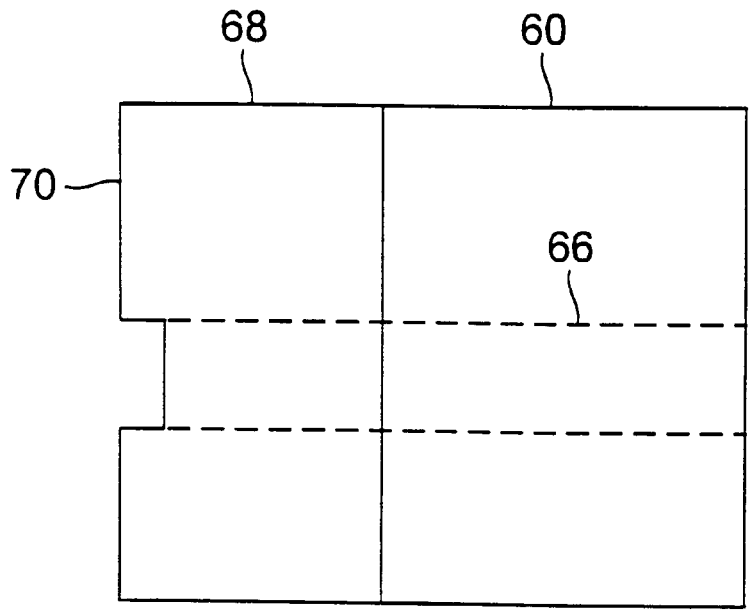
FIG. 2A is a top view of the fixture of FIG. 2.

Referring to FIGS. 2 and 2A, a fixture 60, for feeding superconductor precursor 12 and constraining members 24, 26 between rolls 20, 22, includes a bottom surface 62 having a cut-out 64 defining a slot 66. Fixture 60 is attached to a table (not shown) located at the entrance to rolls 20, 22. The dimensions of slot 66 depend on the cross-sectional sizes of superconductor precursor 12 and constraining members 24, 26. To provide clearance, the width of slot 66 is selected to be about 5 to 10% greater than the sum of the widths of the three elongated elements, and the height of slot 66 is about 10% greater than the height of the largest of the three elements.

The front 68 of fixture 60 tapers to a leading edge 70 to guide the three elements between the rolls close to the contact point where they come in contact with the rolls.

Figure 3:
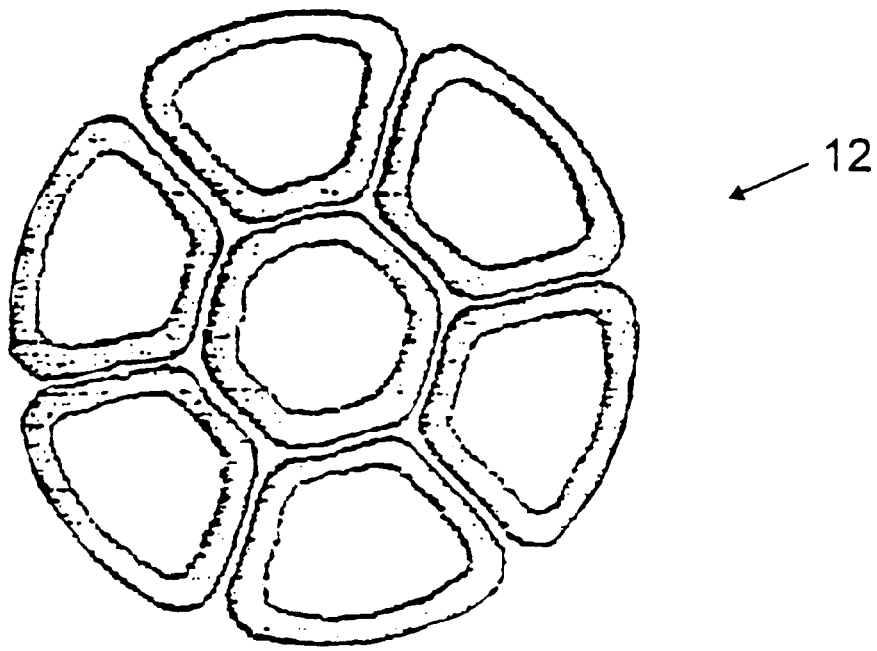
FIG. 3 is a transverse view of a precursor superconductor.
Figure 4:
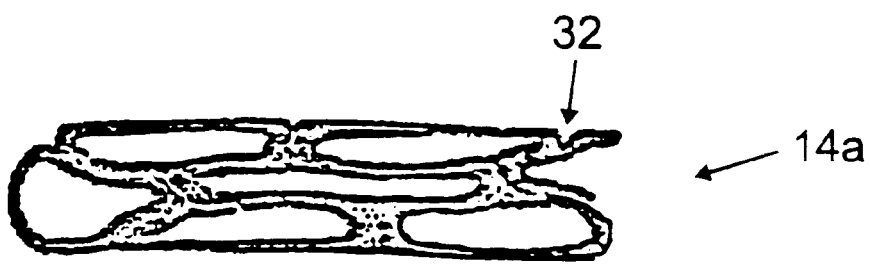
FIG. 4 is an end view of a textured superconductor formed by a prior art groove rolling technique.
Figure 4A:
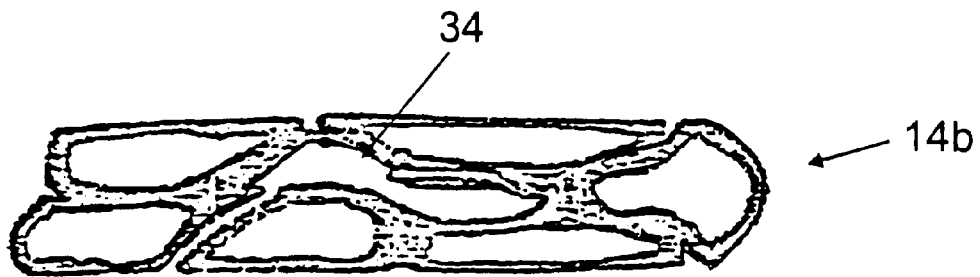
FIG. 4A is an end view of another textured superconductor formed by a prior art groove rolling technique.

Referring to FIG. 3, a seven-count filament superconductor precursor 12 is illustrated. The individual filaments are solder bonded together to form precursor 12. FIGS. 4 and 4A illustrate textured conductors 14a and 14b formed by prior art single pass, unconstrained groove rolling of precursor 12. Textured conductors 14a and 14b were formed without supporting the precursor in the lateral direction. As shown at positions 32 and 34, undesired edge cracking (FIG. 4) and shearing (FIG. 4A) are evident in textured conductors formed by unconstrained, single pass groove rolling. Additionally, the conventional groove rolling technique lacks the ability to set the desired amount of lateral spread.

Figure 5:
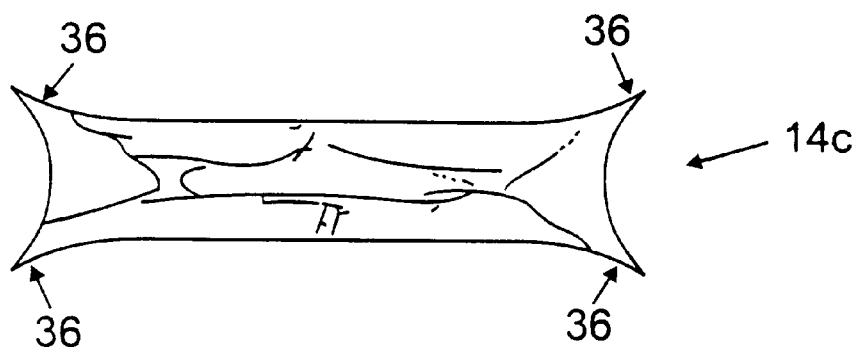
FIG. 5 is a diagrammatic representation of an end view of a textured superconductor formed by a prior art Turks head rolling technique.

While Turks head deformation provides increased control over the dimensional aspects as well as enhanced uniform deformation due to the improved mechanical support provided in the lateral direction by the two additional rolls and with that technique, moderate and large area reductions are not possible with a Turks head operation without significant "flashing" of the material. As shown at 36 in FIG. 5, flashing of textured conductor 14c occurs at the corners of the textured conductor requiring an additional manufacturing step to remove the flashing. (Flashing is an imperfection in the conductor that may result in permanent damage to the conductor. It is not removed simply.)

Figure 6:
FIG. 6 is an end view of a textured superconductor wire formed by the constrained rolling of the invention.

FIG. 6 illustrates a textured wire 14 formed according to the invention. As shown, constrained, single pass rolling permits large area reductions of precursor 12 cross section without edge cracking, shearing, or flashing. Thus, filament quality is improved over conventional groove rolling, and textured wire 14 need not be reworked to remove flashing as with Turks head forming. The textured wire 14 of the invention has regular, convexly curve shaped side walls 40 rather than the irregular side walls of the prior art textured conductors of FIGS. 4, 4A and 5.

While experimental results show a 65–70% reduction in thickness of precursor 12 without creating defects using unconstrained single pass groove rolling, constrained single pass rolling according to the invention produces an 85–90% reduction in thickness without producing defects for the same size precursor 12. When the individual filaments in precursor 12 are not bonded together, texturing with unconstrained groove rolling could not be performed, while an 85% reduction in thickness is obtainable using constrained single pass rolling of the invention.

Precursor 12 can be, for example, of round or rectangular cross section, having a ratio up to about 10:1 for rectangular wires, and can be rolled into a wire having a ratio of about 1:1 to 300:1. In some applications, low aspect ratio textured wires are preferred to reduce AC losses and enable winding and cabling of the textured tapes, as discussed in U.S. patent application Ser. No. 08/554,693.

The diameter and cross-sectional shape of constraining members 24, 26 affects the amount of mechanical support and lateral spread constraint placed on precursor 12 during the rolling process. For, example, a seven filament count precursor 12 of diameter 0.053" rolled between two inch diameter unheated flat rolls spaced 0.015" apart, rolling with constraining members of 0.025" diameter produces textured wire 14 of about 0.015" thick and about 0.077" width; rolling with constraining members of 0.035" diameter produces textured wire 14 of about 0.015" thick and about 0.068" width; and rolling with constraining members of 0.060" diameter produces textured wire 14 of about 0.015" thick and about 0.053" width. The constraining members can be of cross sections other than round illustrated herein.

Constraining members 24, 26 should be formed of a material having mechanical properties which closely match the mechanical properties of the superconductor precursor being rolled. For example, silver or copper, which are ductile and close in strength to the superconductor precursor, are suitable materials.

Precursor superconductor multi-filament members 12 can be formed according to the metallic precursor (MP) process as described in Progress Towards a Long Length Metallic Precursor Process for Multifilament Bi-2223 Composite Superconductors by Otto et al., *IEEE Transactions on Applied Superconductivity*, Vol. 5, No. 2, June 1995, the contents of which are incorporated by reference, in their entirety, herein. Briefly, for a Bi-2223 oxide/silver composite superconductor, powder elements (Bi, Pb, Sr, Ca, Cu and Ag) are mixed together according to known mechanical alloying processes. Precursor 12, for example, is produced by repeated extrusion of the precursor alloy powder packed in a silver can, followed by oxidation and then reaction by thermal treatments to form Bi-2212 superconducting oxide grains and "0011" reactant.

The Bi-2212 in precursor 12 is then crystallographically textured by deformation at strains that are approximately 1/1000th of the strain required to fabricate the precursor. After texturing, textured wire 14 is reacted to form Bi-2223, as is well known in the art.

Precursor superconductor 12 can also be formed by the "oxide-powder-in-tube" method as described in K. H. Sandhage, Critical Issues in the OPIT Processing of High $J_c$ BSCCO Superconductors, Journal of Metals, Vol. 43 (March 1991), pp. 21–25, the contents of which are incorporated by reference, in their entirety, herein. In this method, superconducting oxide powder is used as the "precursor" instead of precursor alloy powder. In either instance, as a result of the constrained rolling process, the powder density is increased significantly, for example form 50 percent to 80 percent.

Figure 7:
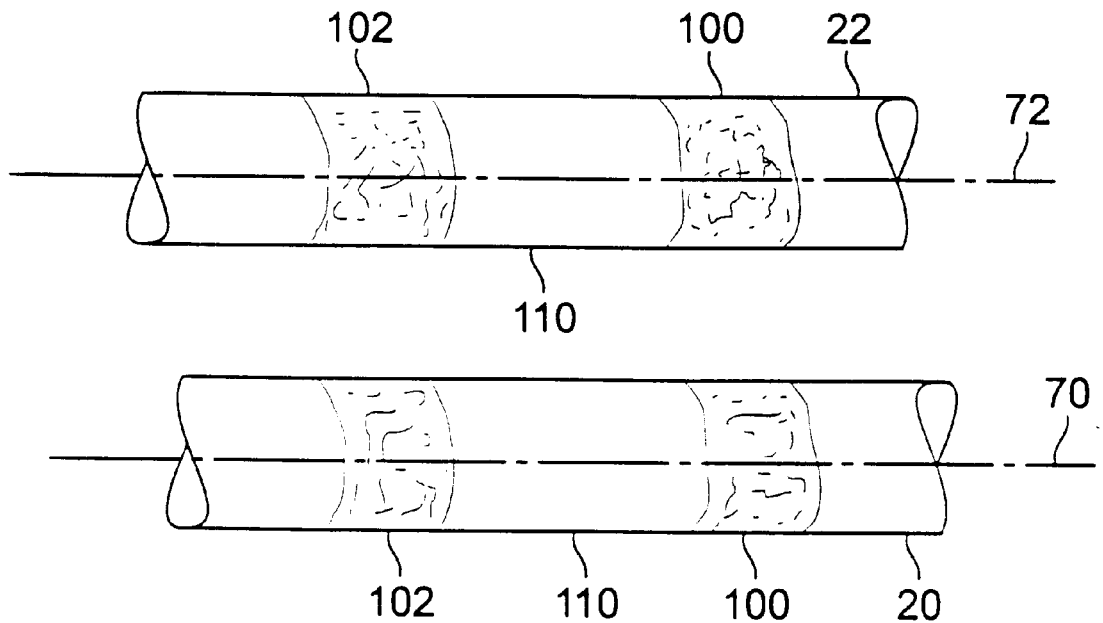
FIG. 7 is a conceptual view of the rollers in accordance with a first alternate embodiment of the invention.
Figure 8:
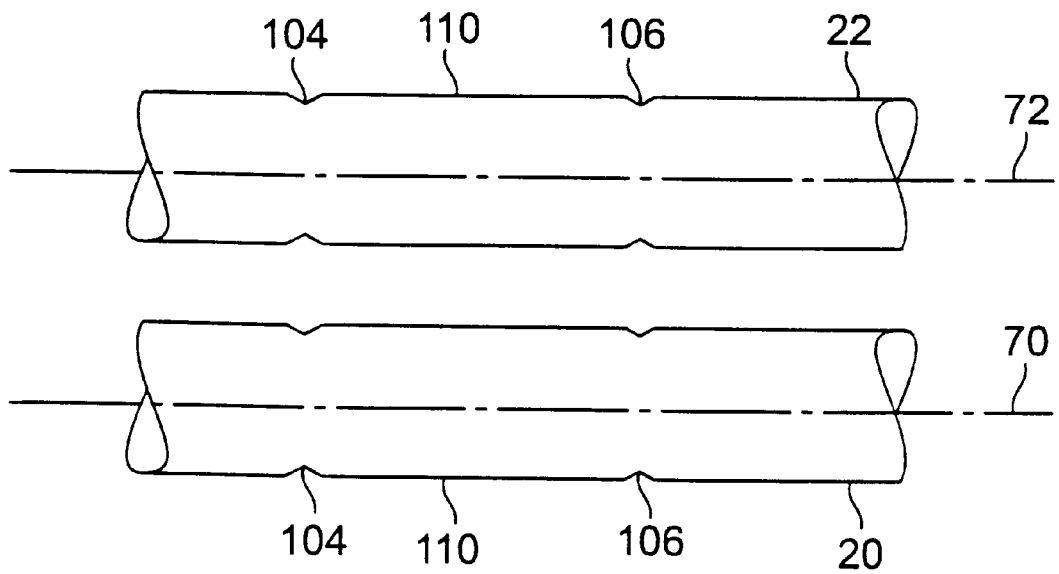
FIG. 8 is a conceptual view showing the rollers according to a second alternate embodiment of the invention.

Referring to FIGS. 7 and 8, in alternate embodiments of the invention, the rolls 20 and 22 can be machined to provide only the constraining members 24, 26 with a further mechanical resistance which affects their lateral movement and, accordingly affects lateral constraint acting on the superconductor precursor 12. In FIG. 7, the flat rolls are machined in areas 100, 102 to "roughen" the surface of the roll, thereby changing the interaction at the interface between the constraining members 24, 26 and the rolls. In FIG. 8, the machining of the rolls 20, 22 takes the form of "indentations" 104, 106 (which can be of any suitable shape and depth) to help constrain and guide the constraining members as they pass through the rolls 20, 22. In this manner, the lateral movement of the constraining members can be mechanically affected thereby causing a different lateral constraint on the superconductor precursor. Other approaches to providing spaced-apart rolls 20, 22 along with a mechanical constraint on the constraining members will be apparent and can be employed. Note, however, that the superconductor precursor contacts only the flat roll in the central region 110 of the rolls.

The invention is applicable to any desired superconducting oxide which is in itself micaceous or semi-micaceous, or which has micaceous or semi-micaceous precursors. A micaceous structure is characterized by highly anisotropic preferred cleavage planes and slip systems. Semi-micaceous structures are characterized by a highly anisotropic, plate-like structure but poorly defined cleavage planes and slip systems. The BSCCO family of oxide superconductors are examples of micaceous forms, and the TBSCCO family of oxide superconductors and the HBSCCO family of oxide superconductors are examples of semi-micaceous structures. Micaceous or semi-micaceous precursors of a desired oxide superconductor may also be used, such as BSCCO 2212 precursors, which are micaceous, when the desired oxide superconductor is BSCCO 2223.

As used in this disclosure, the term "superconductor precursor" (or "precursor superconductor") is intended to include precursor alloy powders, superconductor oxide powder, or other materials which can be passed through the constrained rolling assembly as part of the manufacturing process for making superconductor wires. Further, the rolls are typically run unheated, meaning the textured output wire 14 is typically not a superconductor, but is a textured superconductor precursor or intermediate wire which must be further processed to produce the textured superconductor wire. In the context of the description herein, textured superconductor wire is intended to include a textured superconductor precursor wire. However, the output superconductor wire from the rolling assembly will typically require reacting the precursor at elevated temperatures and pressures as is known in this field.

Additions, subtractions and other modifications of the illustrated embodiments of the invention will be apparent to those practiced in the art and are within the scope of the following claims.

What is claimed is:

1. A method of texturing a superconductor oxide precursor, comprising the steps of:
    constraining an elongated superconductor oxide precursor between two constraining elongated members placed in contact therewith on opposite sides of the superconductor oxide precursor, and
    passing the superconductor precursor and the two constraining members with the two constraining members in contact with the superconductor precursor between flat rollers to texture the superconductor oxide precursor, upon passage between the flat rollers, the two constraining members are separate from the superconductor oxide precursor.

2. The method of claim 1 further comprising the step of selecting desired diameter constraining members to control a width of a formed textured superconductor oxide precursor.

3. The method of claim 1 further comprising the step of selecting constraining members having mechanical properties similar to that of the superconductor oxide precursor.

4. The method of claim 3 wherein one of the mechanical properties is ductility.

5. The method of claim 3 wherein one of the mechanical properties is strength.

6. The method of claim 1 further comprising the step of
    machining said flat rolls at locations on the roll in contact with said elongated members prior to said passing step.

7. The method of claim 1 further comprising the step of
    mechanically controlling lateral movement of said constraining members during said passing step.

8. A method of texturing a superconductor oxide precursor, comprising the steps of:
    providing an elongated superconductor oxide precursor which includes powder enclosed within a surrounding sheath,
    constraining the elongated superconductor oxide precursor between two constraining elongated members placed in contact therewith on opposite sides of the superconductor oxide precursor, and
    passing the superconductor precursor and the two constraining members with the two constraining members in contact with the superconductor precursor between flat rollers to texture the superconductor oxide precursor.

* * * * *